US012676629B2

(12) United States Patent
Liu et al.

(10) Patent No.: US 12,676,629 B2
(45) Date of Patent: Jul. 7, 2026

(54) SYSTEM AND METHOD OF GENERATING SIGNALS FOR ANALOG-DIGITAL CONVERTER (ADC) CALIBRATION

(71) Applicant: Avago Technologies International Sales Pte. Limited, Singapore (SG)

(72) Inventors: Yong Liu, Irvine, CA (US); Xi Yang, Irvine, CA (US); Xiaochen Yang, Irvine, CA (US); Jun Cao, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 251 days.

(21) Appl. No.: 18/498,321

(22) Filed: Oct. 31, 2023

(65) Prior Publication Data

US 2025/0141466 A1     May 1, 2025

(51) Int. Cl.
*H03M 1/12* (2006.01)
*H03M 1/10* (2006.01)
*H03M 1/50* (2006.01)

(52) U.S. Cl.
CPC ......... *H03M 1/508* (2013.01); *H03M 1/1014* (2013.01); *H03M 1/10* (2013.01); *H03M 1/12* (2013.01); *H03M 1/50* (2013.01)

(58) Field of Classification Search
CPC ...... H03M 1/508; H03M 1/1014; H03M 1/10; H03M 1/50; H03M 1/12
See application file for complete search history.

(56) References Cited

U.S. PATENT DOCUMENTS

2022/0173946 A1* 6/2022 Wu ........................... H03L 7/23
2022/0345144 A1   10/2022 Azadet et al.

FOREIGN PATENT DOCUMENTS

ES          2534958 A1    2/2016
WO    WO-2022/263272 A1   12/2022

OTHER PUBLICATIONS

Bhatheja et al. "Low-Cost High Accuracy Stimulus Generator for On-chip Spectral Testing", IEEE, 2022, pp. 514-518.
Extended European Search Report on EP Appln. No. 24205614.1 dated Jun. 10, 2025.
M.F Toner et al. "A Bist for an SNR Test of a Sigma-Delta ADC", IEEE, dated 1993, pp. 805-814.
Zhang et al. "An FPGA-Based Hardware Platform for the Control of Spin-Based Quantum Systems", IEEE Transactions and Measurement, vol. 69, No. 4, dated Apr. 2020, pp. 1127-1139.

* cited by examiner

*Primary Examiner* — Joseph J Lauture
(74) *Attorney, Agent, or Firm* — Foley & Lardner LLP

(57) ABSTRACT

A device may include an oscillator and a driver. The oscillator may be coupled to circuitry providing calibration of the oscillator. The oscillator may receive from the circuitry a first signal that causes the oscillator to generate a second signal having a first frequency to be used for calibration of an analog-to-digital converter (ADC). The driver may be coupled to the oscillator and the ADC. The driver may receive the second signal from the oscillator. The driver may receive a third signal indicating an amplitude to apply to the second signal. The driver may provide, to the ADC based at least on the second signal and the third signal, an output signal having the first frequency and the amplitude.

20 Claims, 8 Drawing Sheets

3000

7000

SYSTEM AND METHOD OF GENERATING SIGNALS FOR ANALOG-DIGITAL CONVERTER (ADC) CALIBRATION

FIELD OF THE DISCLOSURE

This disclosure generally relates to systems and methods for controlling analog-digital converters (ADCs), and more particularly to efficiently generating signals for ADC calibration.

BACKGROUND

In data communication systems, e.g., narrow-band communication systems like 5G wireless systems, high-performance and high-resolution ADCs can be used to capture and convert radio frequency (RF) signals to digital signals. With complementary metal-oxide semiconductor (CMOS) technology scaling, time interleaving of a plurality of unit ADCs, e.g., Successive Approximation (SAR) ADCs, can achieve low power and compact area. Time-interleaved ADCs can also achieve a wide range of data sampling frequency, e.g., tens of GHz. Time-interleaved ADCs can have a wide variety of applications in modern high-performance data communication and processing systems, including but not limited to wireless systems, base stations, networking switches, serializer/deserializer (SERDES) PHYs, optical receivers, data acquisition systems, sensors, etc. For example, compared with analog mixer based receivers, RF direct sampling receivers implemented with time-interleaved ADCs can pave ways for low-power and high-performance data communication systems, e.g., wireless systems, 5G wireless base stations, or electrical and optical links. Time-interleaved ADCs may be subject to intrinsic interleaving errors, such as direct current (DC) offset, and/or gain and skew errors between the unit ADCs. These errors can be calibrated using input signals before the ADC is put in use to process the live data. However, it would be difficult to efficiently generate such input signals that can guarantee sufficiently fast error detection and calibration convergence.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

Figure 1:
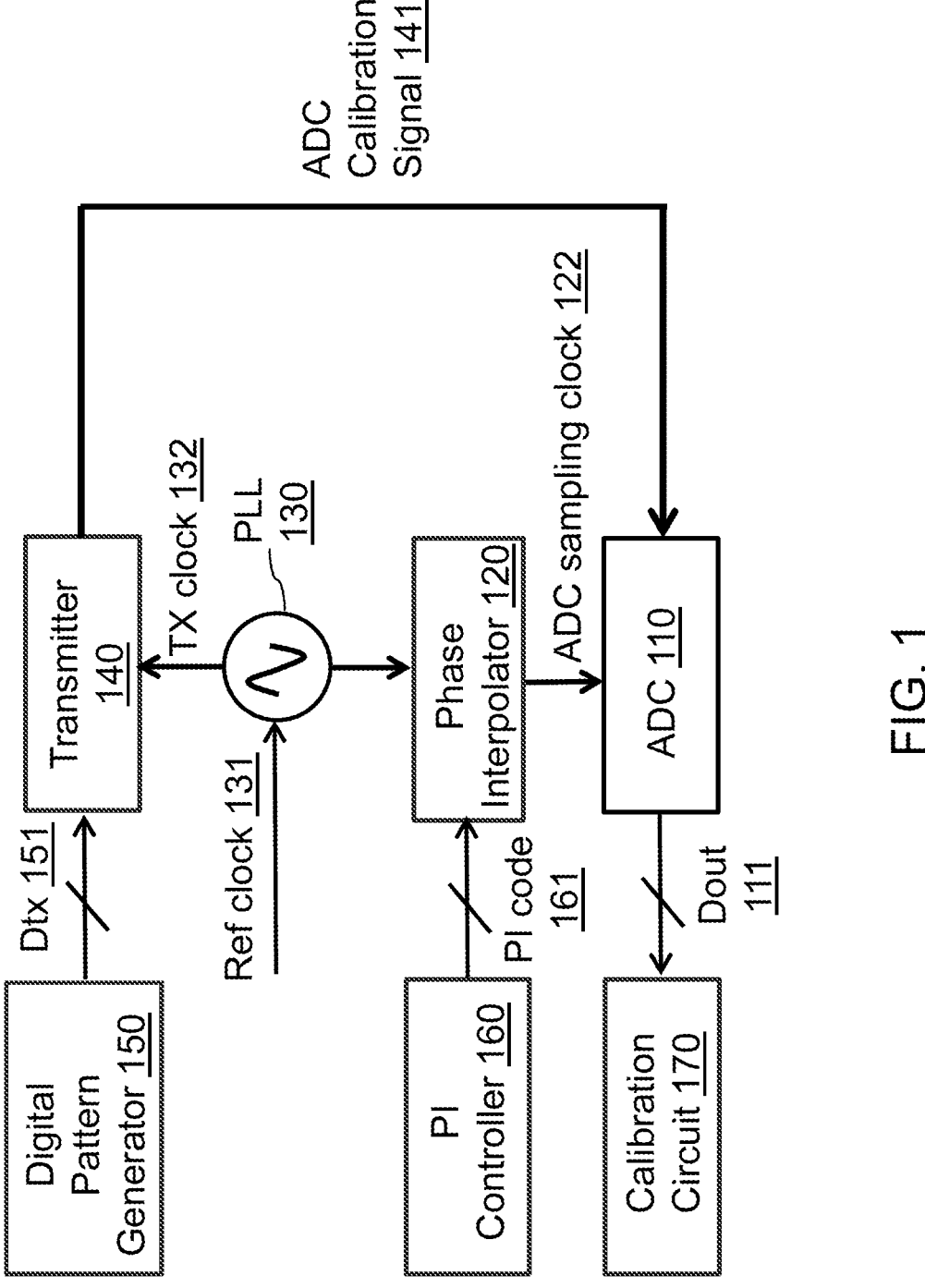
FIG. 1 is a schematic block diagram of an example system of generating signals for ADC calibration.

The details of various embodiments of the methods and systems are set forth in the accompanying drawings and the description below.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Various embodiments disclosed herein are related to a device including an oscillator and a driver. In some embodiments, the oscillator may be a ring oscillator that is any circuit or hardware that includes a plurality of amplifiers in a ring to generate an output oscillating between two voltage levels. Each of the plurality of amplifiers may be one of a buffer, an inverter, a NOT gate, a non-inverting amplifier. In some embodiments, the device may be implemented in an integrated circuit or chip. The oscillator may be coupled to circuitry providing calibration of the oscillator. The oscillator may be configured to receive from the circuitry a first signal that causes the oscillator to generate a second signal having a first frequency to be used for calibration of an analog-to-digital converter (ADC). In some embodiments, the circuitry may include (1) hardware, one or more processors (e.g., microprocessor) or a combination of hardware and/or one or more processors with software and/or firmware; or (2) a single component or a combination of multiple components. The ADC may be a time-interleaved ADC, a successive approximation (SAR) ADC, a delta-sigma ADC, a dual slope ADC, a pipelined ADC, a flash ADC, or any circuit, hardware, or any combination thereof that can perform analog-digital conversion. The driver may be coupled to the oscillator and the ADC. The driver may be configured to receive the second signal from the oscillator. The driver may be configured to receive a third signal indicating an amplitude to apply to the second signal. The driver may be configured to provide, to the ADC based at least on the second signal and the third signal, an output signal having the first frequency and the amplitude.

In some embodiments, the second signal may be a pair of complementary signals. In some embodiments, the pair of complementary signals may have two signals that are 180 degrees out of phase with each other. In some embodiments, the driver may be configured to receive a fourth signal indicating a rise time and a fall time to apply to the second signal. The driver may be configured to provide, to the ADC based at least on the second signal, the third signal and the fourth signal, an output signal having the first frequency, the amplitude, the rise time, and the fall time. In some embodiments, a rise time of a signal (e.g., a voltage signal or a current signal) may be a time taken by the signal to change from a specified low value to a specified high value. These values may be expressed as ratios or, equivalently, as percentages with respect to a given reference value, for example, 10% and 90% (or equivalently 0.1 and 0.9) of an amplitude of the signal or a height of a step function of the signal. In some embodiments, a fall time of a signal (e.g., a voltage signal or a current signal) may be a time taken by the signal to change from a specified high value to a specified low value. These values may be expressed as ratios or, equivalently, as percentages with respect to a given reference value, for example, 90% and 10% (or equivalently 0.9 and 0.1) of an amplitude of the signal or a height of a step function of the signal.

In some embodiments, the driver may include one or more amplifiers coupled to the oscillator and configured to amplify the second signal based at least on the third signal to generate the output signal. The driver may include one or more capacitors coupled to an output of the one or more amplifier. The driver may be configured to provide, to the ADC, the output signal through the one or more capacitors. The driver may include one or more switches coupled to an output of the one or more amplifiers. The driver may be further configured to receive a fifth signal indicating to enable or disable the driver such that the driver is enabled during the calibration of the ADC and is disabled responsive to the ADC being calibrated. The driver may be configured to turn on or turn off the one or more switches according to the fifth signal.

In some embodiments, the ADC may receive one or more input signals through a first amplifier. The driver may be configured to turn off the first amplifier during the calibration of the ADC and turn on the first amplifier responsive to the ADC being calibrated. The driver may be configured to provide, to the first amplifier, a sixth signal indicating to enable or disable the first amplifier such that the first amplifier is disabled during the calibration of the ADC and is enabled responsive to the ADC being calibrated. The driver may be configured to turn on or turn off the first amplifier according to the sixth signal. The ADC may receive the one or more input signals further through a second amplifier that has impedance smaller than impedance of the first amplifier. The driver may be configured to provide the output signal to the ADC through the second amplifier during the calibration of the ADC. In other words, during the calibration of the ADC, the driver may be configured to provide the output signal to the second amplifier that has impedance smaller than the impedance of the first amplifier, and the ADC may receive the one or more input signals from the second amplifier.

Various embodiments disclosed herein are related to circuitry including a first circuit coupled to an oscillator, and a second circuit coupled to the oscillator. The first circuit may be configured to receive a signal indicating a first frequency to be used for calibration of an analog-to-digital converter (ADC). The first circuit may be configured to calibrate a frequency of the oscillator. The first circuit may be configured to generate, based at least on the signal and the frequency of the oscillator, one or more first signals. The second circuit may be configured to receive, from the first circuit, the one or more first signals. The second circuit may be configured to control, based at least on the one or more first signals, the oscillator to generate a second signal having the first frequency.

In some embodiments, the first circuit may include a controller, a first counter, and a second counter. The controller may be any circuit, hardware (e.g., microprocessors), software, firmware, or any combination thereof that can control the first counter, the second counter, and the oscillator using one or more control signals. The first counter may be configured to receive a first clock signal outputted from the oscillator. The second counter may be configured to receive a second clock signal. The controller may be a circuit implementing a finite-state machine (FSM).

In some embodiments, the controller may be configured to receive the signal indicating a first quantity corresponding to the first frequency. The controller may be configured to receive a third signal indicating to start calibrating the oscillator. In response to the third signal, the controller may be configured to reset the first counter and the second counter, control each of the first counter and the second counter to start counting, and determine whether a counter number indicated by an output of the second counter is equal to a second quantity. In response to determining that the counter number of the second counter is equal to the second quantity, the controller may be configured to control the first counter to stop counting and determine whether a counter number indicated by an output of the first counter is equal to the first quantity. In response to determining that the counter number of the first counter is not equal to the first quantity, the controller may be configured to generate the one or more first signals. In response to determining that the counter number of the first counter is equal to the first quantity, the controller may be configured to disable the first counter and the second counter.

In some embodiments, the controller may be configured to receive a fifth signal indicating to enable or disable the first circuit such that the first circuit is enabled during the calibration of the ADC and is disabled responsive to the ADC being calibrated.

In some embodiments, the oscillator may be a ring oscillator including a plurality of amplifiers. The one or more first signals may include a first control signal and a second control signal. The second circuit may be configured to determine a first number of amplifiers, among the plurality of amplifiers, according to the first control signal. The second circuit may be configured to enable the first number of amplifiers, among the plurality of amplifiers. The second circuit may be configured to determine a second number of capacitors according to the second control signal. The second circuit may be configured to connect the second number of capacitors to respective amplifiers, among the plurality of amplifies.

In some embodiments, the second circuit may be configured to receive a sixth signal indicating to enable or disable the oscillator such that the oscillator is enabled during the calibration of the ADC and is disabled responsive to the ADC being calibrated. The second circuit may be configured to enable or disable the oscillator according to the sixth signal.

Various embodiments disclosed herein are related to a method. The method includes receiving, by a first circuit coupled to an oscillator, a signal indicating a first frequency to be used for calibration of an analog-to-digital converter (ADC). The method may include calibrating, by the first circuit, a frequency of the oscillator. The method may include generating, by the first circuit based at least on the signal and the frequency of the oscillator, one or more first signals. The method may include receiving, by a second circuit coupled to the oscillator, from the first circuit, the one or more first signals. The method may include controlling, by the second circuit based at least on the one or more first signals, the oscillator to generate a second signal having the first frequency.

In some embodiments, the second circuit may receive a further signal indicating to enable or disable the oscillator such that the oscillator is enabled during the calibration of the ADC and is disabled responsive to the ADC being calibrated. The second circuit may enable or disable the oscillator according to the further signal.

In one aspect, in data communication systems, e.g., narrow-band communication systems like 5G wireless systems, high-performance and high-resolution ADCs can be used to capture and convert RF signals to digital signals. With CMOS technology scaling, time interleaving of a plurality of unit ADCs, e.g., SAR ADCs, can achieve low power and compact area. Time-interleaved ADCs can also achieve a wide range of data sampling frequency, e.g., tens of GHz. Time-interleaved ADCs can have a wide variety of applications in modern high-performance data communication and processing systems, including but not limited to wireless systems, base stations, networking switches, SERDES PHYs, optical receivers, data acquisition systems, sensors, etc. For example, compared with analog mixer based receivers, RF direct sampling receivers implemented with time-interleaved ADCs can pave ways for low-power and high-performance data communication systems, e.g., wireless systems, 5G wireless base stations, or electrical and optical links.

Time-interleaved ADCs may be subject to intrinsic interleaving errors, such as direct current (DC) offset, and/or gain and skew errors between the unit ADCs. These errors can be calibrated using input signals (e.g., training signals) before the ADC is put in use to process the live data. However, it would be difficult to efficiently generate such input signals that can guarantee sufficiently fast error detection and calibration convergence. For example, while the interleaving DC offset errors can be detected by zero-in of the ADC input, calibration of interleaving gain and skew errors may require certain input signals to be in a certain frequency range and in a certain amplitude range to guarantee sufficiently fast error detection and calibration convergence. In addition, calibration may require that the signal received by each individual unit ADC should not have any data-dependent intrinsic DC offset, and/or gain and skew errors. Otherwise, the errors from the unit ADCs cannot be correctly calibrated.

Such input/training signals for calibration can be provided and/or generated from the external systems or circuits. An example of such external systems or circuits are shown in FIG. 1. FIG. 1 is a schematic block diagram of an example system 1000 of generating signals for ADC calibration (e.g., on-chip signal generator). The system 1000 may include an ADC 110, a phase interpolator 120, a phase-locked loop (PLL) 130 configured to output clock signals based on a reference clock signal 131, a transmitter (TX) 140, a digital pattern generator 150, a phase interpolator (PI) controller 160, and/or a calibration circuit 170. The digital pattern generator 150 may generate a signal (Dtx) 151 having a certain data pattern, such as a 1-tone continuous-wave (CW) signal, or a random wide-band pseudo random binary sequence (PRBS) signal. The signal 151 may be sent to the transmitter 140, which provides the signal 151 (as an ADC calibration signal 141) to the ADC 110. The ADC may convert the calibration signal 141 to an analog signal (Dout) 111 which is provided to the calibration circuit 170.

Referring to FIG. 1, the transmitter 140 may receive a clock signal (e.g., TX clock signal 132) from the PLL 130. In one case, a single PLL (not shown) may provide clock signals (not shown) to the transmitter 140 and the ADC 110, respectively. In another case, a TX PLL (not shown) and an ADC PLL (not shown) may be separate and share the same reference clock source. In both cases, the phase of a TX signal can be well aligned to the phase of an ADC sampling clock signal, which can potentially generate intrinsic gain and skew errors. To remove this data dependency (between TX signals and ADC sampling clock signals), a phase interpolator (e.g., PI 120) may be used. For example, the PI controller 160 may provide to the PI 120 a PI code 161 that is constantly adjusted to create a small frequency shift from an ADC sampling clock signal (e.g., clock signal 122). In this manner, the ADC sampling clock signal 122 can be suitable for time-interleaved ADC calibration. However, in the systems in the field, such signals may not always be found or readily available during the system power up and ADC calibration. Even if it is possible to generate and send such signals to the ADC, the generation of such signals may incur more infrastructure resource overhead (such as power splitter, multiplexer, router, buffers etc.) and preparation time. For example, referring to FIG. 1, the system 1000 may include the PI 120 and PI controller 160 to generate a signal suitable for ADC calibration. In general, there may be tight system/time requirements (e.g., chip bring-up time) to generate such signals suitable for ADC calibration.

To solve this problem, according to certain aspects, embodiments in the present disclosure relate to a technique to generate calibration signals at various frequencies and amplitudes for ADC calibration (e.g., calibration of ADC errors such as DC offset, gain and skew errors). In some embodiments, an oscillator may be used to generate calibration signals for ADC calibration. The oscillator may be an RC oscillator, an LC resonator-based oscillator, a harmonic oscillator, a relaxation oscillator, a ring oscillator, voltage-controlled oscillator, or any electronic circuit that can produce a periodic, oscillating or alternating signal. In some embodiments, an oscillator (e.g., on-chip ring oscillator) may be used to generate calibration signals for ADC calibration. The oscillator may be implemented with a delay-based oscillator or a delay-line oscillator, which is very compact and power efficient compared to other types of oscillators (e.g., linear electronic oscillator circuit such as a phase-shift oscillator).

In some embodiments, a system may include an ADC, a first buffer, a second buffer, a driver (e.g., driver circuit), an oscillator, an oscillator calibrator (e.g., oscillator calibrator circuit) and/or an ADC calibrator. The ADC calibrator may be any circuit, hardware (e.g., microprocessors), software, firmware, or any combination thereof that can perform calibration of an ADC. Each of the first buffer and the second buffer may be an amplifier with differential inputs (e.g., operational amplifier). The oscillator may be coupled to the driver and the oscillator calibrator. The oscillator calibrator may receive a reference clock (from an external device or clock source) and a clock signal from the oscillator. The oscillator calibrator may calibrate a frequency of the oscillator. The oscillator calibrator may be any circuit, hardware (e.g., microprocessors), software, firmware, or any combination thereof that implements an oscillator calibration logic that can perform calibration of the frequency of the oscillator. Based on a result of the frequency calibration, the oscillator calibrator may send a control signal to the oscillator to set the frequency of the oscillator to a certain frequency or within a range of frequencies (e.g., target frequency range). After the oscillator frequency is calibrated to be within a target frequency range, the oscillator may send an output signal (e.g., oscillator output signal) to the driver. The output signal may be a single-ended signal or complementary signals (or differential signals). The complementary signals may include a pair of complementary signals (e.g., a positive output signal and a negative output signal).

In some embodiments, the oscillator calibrator may adjust or control the frequency of the oscillator to meet a signal frequency requirement of an ADC calibration. In some embodiments, not all 1-tone signals (e.g., a single tone signal which has one frequency) can be used for calibration of a time-interleaved ADC. Assume that a frequency Fin of an input signal, which is a 1-tone signal, is expressed as follows:

$$Fin = Fs * M/(N * K) \qquad \text{(Equation 1)}$$

$$Fsar = Fs/N \qquad \text{(Equation 2)}$$

where Fs is a sampling clock frequency of the time-interleaved ADC, N is the number of unit ADCs in the time-interleaved ADC, M and K are integer numbers, and Fsar is a sampling clock frequency of a unit ADC.

If an input signal frequency satisfies Equation 1, there may be a potential risk that the 1-tone signal Fin may introduce data-dependent gain errors and cannot be used as a calibration signal. For example, if K=1, Fin=M*Fs/N=M*Fsar, which indicates that the sampled data on each unit ADC may have only one fixed value, thereby incurring data-dependent gain errors. This significant data-dependent gain errors among unit ADCs may cause interleaving enormous gain calibration errors.

A simulation result shows simulated residual interleaving gain errors calibrated with a 1-tone signal at various calibration signal frequencies (e.g., normalized calibration signal frequencies). It is shown that there are certain frequencies that are not suitable for ADC calibration because of high interleaving gain errors, e.g., 7 Fsar, 7.25 Fsar, 7.5 Fsar, 7.75 Fsar, 8 Fsar, 8.25 Fsar, 8.5 Fsar, etc. It is also shown that there is a frequency range suitable for ADC calibration (e.g., target frequency range).

Based on this simulation result, a system (e.g., an oscillator calibrator or an ADC calibrator) can calculate or choose a target frequency range for a 1-tone calibration signal. In some embodiments, the system may use Equation 1 to calculate a target frequency range for a 1-tone calibration signal. In some embodiments, the system may use Equation 1 to calculate frequencies or a frequency range unsuitable for a 1-tone calibration signal. As long as the signal frequency (e.g., input signal frequency) falls in the target frequency range, an ADC calibration system can achieve good calibration results of interleaving gain. In some embodiments, after calculating a target frequency range (e.g., by the oscillator calibrator or the ADC calibrator), the oscillator calibrator may send a control signal to the oscillator to set the frequency of the oscillator within the calculated target range of frequencies. After the oscillator frequency is calibrated to be within the target frequency range, the oscillator may send an output signal (e.g., oscillator output signal) to the driver.

In some embodiments, the driver may receive, as an input signal, the output signal from the oscillator and adjust an amplitude and/or a bandwidth of the input signal according to an amplitude control signal (or attenuation control signal) and/or a bandwidth control signal, respectively. In some embodiments, the ADC calibrator may generate the amplitude control signal and/or the bandwidth control signal. The bandwidth control signal may adjust a rise time and/or a fall time of the input signal. Based on a result of the adjustment, the driver may generate an output signal which is to be injected or provided to a main data path toward the ADC. The output signal may be a pair of signals that are 180 degrees out of phase with each other. In some embodiments, the output signal may be provided to an output of the first buffer and an input of the second buffer. The first buffer may have impedance higher than impedance of the second buffer. In a calibration mode, the driver may be enabled according to an enable control signal, the second buffer may be enabled according to an enable control signal, and the first buffer may be disabled according to an enable control signal. For example, the first buffer (e.g., amplifier) may be powered down according to the enable control signal during the calibration to isolate input signals of the ADC, as well as maximize the swing of the calibration signal (e.g., output signal of the driver). In response to the calibration mode, the signal injected from the driver may be sent or provided to the second buffer, so that an output signal of the second buffer can be provided to the ADC for calibration. In a normal mode (e.g., ADC mode), the driver may be disabled according to an enable control signal, the second buffer may be disabled according to an enable control signal, and the first buffer may be enabled according to an enable control signal. In response to the normal mode, an analog signal may be sent or provided to the first buffer, so that an output signal of the first buffer can be provided to the ADC for analog-digital conversion. In some embodiments, the ADC calibrator may determine the calibration mode or the normal mode, and generate, based on a result of the determination, the respective enable control signals of the driver, the first buffer and the second buffer.

In some embodiments, the driver may adjust an amplitude and/or a bandwidth of the input signal to meet one or more requirements (e.g., requirement of the amplitude of a calibration signal). Besides the frequency, the amplitude of the calibration signal may also affect the calibration of interleaving gain and/or skew. In some embodiments, the amplitude of a calibration signal may be set or adjusted to be less than the full scale of the ADC to avoid clipping. In some embodiments, the amplitude of the calibration signal may be set or adjusted to be large enough to have a sufficiently short calibration time. For example, a target range of the amplitude of a calibration signal may be from −10 dBFS (i.e., decibels relative to full scale) to −2 dBFS. In some embodiments, the driver may adjust an amplitude of the input signal to be within a target range of the amplitude of a calibration signal (e.g., −10 dBFS to −2 dBFS) to generate an output signal which is to be provided to the ADC for calibration.

In some embodiments, the driver or driver circuit may include a pair of amplifiers (or buffers) with controls, a pair of capacitors respectively coupled to the pair of amplifiers, and/or a pair of switches (e.g., a pair of transistors) respectively coupled to the pair of capacitors. The capacitors may be AC coupling capacitors that are used to ensure reliability and accommodate different supply domains. The switches may be high speed switching transistors (e.g., bipolar junction transistors (BJT) or metal-oxide-semiconductor field-effect transistor (MOSFET)). The pair of amplifiers may receive, as input signals, a pair of complementary clock signals (e.g., a pair of clock signals that are 180 degrees out of phase with each other) from the oscillator, respectively, adjust an amplitude or signal strength of the respective input signals according to respective attenuation control signals, and generate an output signal (e.g., calibration signal) with the adjusted amplitude or signal strength. The switches may be turned on according to the respective enable control signals (e.g., indicating a value of 1) during calibration of an ADC. In some embodiments, the ADC calibrator may determine the calibration mode or the normal mode, and generate, based on a result of the determination, the respective enable control signals of the switches. In this manner, during the calibration, complementary clock signals from the oscillator may be connected, provided, or injected to an output of the first buffer (e.g., amplifier) through high speed switches.

In some embodiments, a system or a circuit (e.g., oscillator circuit) may control or adjust a frequency of an oscillator according to one or more control signals. The one or more control signals may include a first control signal indicating a coarse control (adjustment) of the frequency, and/or a second control signal indicating a fine control (adjustment) of the frequency. For example, using the first control signal and the second control signal, the oscillator circuit may perform both coarse and fine frequency adjustment of the frequency of the oscillator. The oscillator may be a ring oscillator (e.g., ring oscillator circuit or ring oscillator loop) including a plurality of inverters (e.g., an odd number (n) of inverters). The ring oscillator circuit may include a plurality of multiplexers (e.g., m number of multiplexers where m is less than or equal to n), a plurality of switches (e.g., m number of switches), a plurality of capacitors (e.g., m number of capacitors), and/or a converter.

In some embodiments, the ring oscillator circuit may perform a coarse adjustment of the frequency of the ring oscillator through the first control signal, which controls the number of inverters in the ring oscillator loop. The first control signal may include m number of control signals, each indicating an enable signal or a disable signal. Each of the plurality of multiplexers may select between (1) an input signal of a corresponding inverter or (2) an output signal of the corresponding inverter, according to a corresponding control signal. For example, the ring oscillator circuit may provide, to the m number of multiplexers, the first control signal including k enable signals such that the selected k number of inverters are enabled or turned on (k≤m). The ring oscillator circuit may perform the coarse frequency adjustment to guarantee that the target frequency can be reached under various PVT (process, voltage, temperature) conditions.

In some embodiments, the ring oscillator circuit may perform a fine adjustment of the frequency of the ring oscillator through the second control signal, which controls the number of capacitors loading the ring oscillator loop. The second control signal may include m number of control signals, each indicating a close signal or an open signal. Each of the plurality of switches may selectively connect between (1) an output of a corresponding inverter (or a corresponding multiplexer) and (2) a corresponding capacitor, according to a corresponding control signal. For example, the ring oscillator circuit may provide, to the m number of switches, the second control signal including k close signals such that k number of capacitors are connected to outputs of the corresponding inverters through the selected k switches (k≤m). The ring oscillator circuit may perform the fine frequency adjustment to perform a small frequency calibration of the ring oscillator and ensure that the frequency of the ring oscillator is accurate enough to avoid unsuitable frequencies as shown in the simulation result or as calculated using Equation 1.

In some embodiments, to change the frequency of the ring oscillator, a system or a circuit (e.g., ring oscillator calibrator or ADC calibrator) may use three methods (there are also other methods). First, the system or the circuit can change the number of inverters and/or buffers in the ring oscillator chain, resulting in a higher or lower frequency of the ring oscillator. Second, the system or the circuit can change the supply voltage to the ring oscillator, thereby increasing or reducing the propagation delay through the chain of stages, and changing the frequency of the ring oscillator. Third, the system or the circuit can change the number of capacitors loading the ring oscillator loop, thereby changing the propagation delay through the chain of stages, and changing the frequency of the ring oscillator.

In some embodiments, the converter may be configured to convert a single-ended output signal of the ring oscillator to a pair of complementary output signals (e.g., a pair of output signals that are 180 degrees out of phase with each other). The single-ended output signal may be a signal that is referenced to a shield (for example, earth ground on an output connector). The pair of complementary output signals may have both (1) a first signal on a channel and (2) an inverted version of the first signal (e.g., 180 degrees out of phase with the first signal). The ring oscillator may be only enabled during the ADC calibration according to an enable control signal. During the ADC calibration, the ring oscillator may provide an output signal (e.g., single-ended output signal) to a ring oscillator calibrator circuit. After the calibration is done, the ring oscillator may be disabled according to the enable control signal which indicates 0, for example.

In some embodiments, a system may perform a frequency calibration of a ring oscillator. The system may include a ring oscillator and a circuit (e.g., ring oscillator calibrator circuit) configured to perform a frequency calibration of the ring oscillator. The ring oscillator may be enabled or disabled according to a enable control signal. The ring oscillator may be enabled during ADC calibration to provide an output signal (e.g., single-ended output signal) to the ring oscillator calibrator circuit, and perform adjustment or calibration of the frequency of the ring oscillator (e.g., by ring oscillator circuit) according one or more control signals that are received from the ring oscillator calibrator circuit. After completion of the frequency adjustment or calibration, the ring oscillator may generate an output signal (e.g., a pair of complementary output signals) for the ADC calibration. In some embodiments, the ADC calibrator may determine the calibration mode or the normal mode, and generate, based on a result of the determination, the enable control signal of the ring oscillator.

In some embodiments, the ring oscillator calibration circuit may include a first counter, a second counter, and a controller. The controller may be any circuit, hardware (e.g., microprocessors), software, firmware, or any combination thereof that can control the first counter, the second counter, and the ring oscillator using one or more control signals. In some embodiments, the controller may implement a finite-state machine (FSM). In some embodiments, the FSM may be a finite-state automaton, a finite automaton, a state machine, or any model of computation model that can be in one of a finite number of states at any given time and can change from one state to another in response to some inputs or input signals. The controller may receive a calibration start signal, a signal indicating a target frequency word, a power down signal, and/or a reference clock signal. In some embodiments, an ADC calibrator may generate the calibration start signal, the signal indicating the target frequency word, and/or the power down signal. The reference clock signal may be a system clock signal. The controller may receive a counter output signal (from the first counter). The controller may output (1) a counter reset signal to the first counter and the second counter, (2) a counter enable signal to the first counter and the second counter, and/or (3) one or more control signals including a first control signal for coarse frequency adjustment and a second control signal for fine frequency adjustment, to the ring oscillator. The counter reset signal may be a pulse signal. The first counter may perform counting while being clocked by a clock signal from the ring oscillator, and output the counter output signal indicating a counter value of the first counter. The second counter may receive a number control signal indicating a target counter value, perform counting while being clocked by the reference clock signal, determine whether a counter value of the second counter reaches the target counter value. In response to determining that the counter value of the second counter reaches the target counter value, the second counter may output a counter stop signal to the first counter, thereby controlling the first counter to stop counting.

In response to receiving the calibration start signal, the controller may generate the counter reset signal to reset the first counter and the second counter. In response to receiving the counter reset signal, the controller may reset the first counter and control the first counter to start counting while being clocked by the clock signal from the ring oscillator. In response to receiving the counter reset signal, the controller may reset the second counter and control the second counter to start counting while being clocked by the reference clock signal. In response to determining that the counter value of the second counter reaches the target counter value, as specified by number control signal, the second counter may send out the counter stop signal to stop the first counter from counting. In response to the first counter being stopped, the controller may read the counter output signal indicating the current counter value of the first counter, and compare the current counter value with the target frequency word. In response to determining that the current counter value (of the first counter) is greater than the target frequency word, the controller may generate, based on a difference between the current counter value and the target frequency word, the first control signal and/or the second control signal to adjust (e.g., reduce or decrease) the frequency of the ring oscillator. Similarly, in response to determining that the current counter value (of the first counter) is smaller than the target frequency word, the controller may generate, based on a difference between the current counter value and the target frequency word, the first control signal and/or the second control signal to adjust (e.g., increase) the frequency of the ring oscillator. In some embodiments, the coarse frequency adjustment may be performed first (by the ring oscillator circuit), followed by performing the fine frequency adjustment (by the ring oscillator circuit). In response to determining that the current counter value (of the first counter) is equal to, or sufficiently close (e.g., within a predetermined range) to, the target frequency word, the controller may determine that the frequency calibration is completed, and disable both the first counter and the second counter by setting the counter enable signal to 0, for example. In response to determining that the frequency calibration is completed, the ring oscillator may be used for ADC calibration. In response to determining that the ADC calibration is completed, the ring oscillator calibration circuit may be power down according to the power down signal which is set to 1 (e.g., by the ADC calibrator).

Embodiments in the present disclosure have at least the following advantages and benefits. First, embodiments in the present disclosure can provide useful techniques for generating signals for ADC calibration in a flexible, robust, and compact manner. For example, a ring oscillator according to some embodiments (e.g., on-chip ring oscillator) can introduce flexible calibration signals at various frequencies and amplitudes for ADC calibration. The ring oscillator according to some embodiments can perform robust ADC calibration without relying on external signals (e.g., signals generated by external devices such as PLL, phase interpolator (PI) controller and/or PI). The ring oscillator according to some embodiments can be compact without relying on external devices such as PLL, PI controller and/or PI.

Second, embodiments in the present disclosure can provide useful techniques for providing a self-contained integrated solution for ADC calibration without dependency on external systems and circuits. Without interactions with external circuits and systems, embodiments in the present disclosure can achieve a short chip bring-up and calibration time, and reduce the overall ADC power.

Third, embodiments in the present disclosure can provide useful techniques for providing on-chip signals for ADC calibration for various products (e.g., 5G wireless base station products, ADC based direct sampling 5G wireless base station receivers, power-efficient high-speed data receivers) which use a time-interleaved ADC. Embodiments in the present disclosure can improve the performance of such products by enabling ADC calibration without need of external calibration signal.

Figure 2:
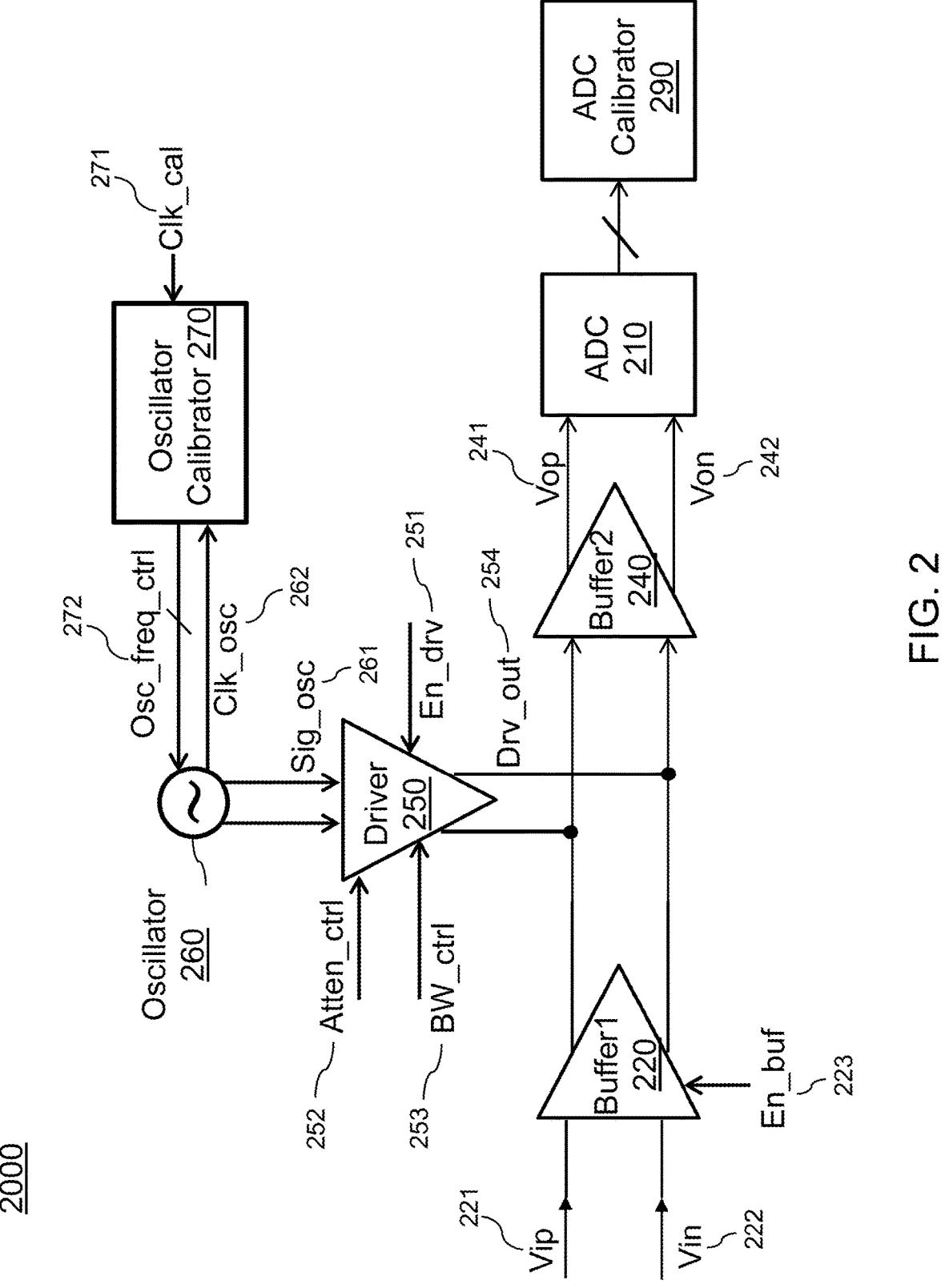
FIG. 2 is a schematic block diagram of an example system of generating signals for ADC calibration using an oscillator, according to an embodiment.

FIG. 2 is a schematic block diagram of an example system 2000 of generating signals for ADC calibration using an oscillator 260, according to an embodiment. The oscillator 260 may be an RC oscillator, an LC resonator-based oscillator, a harmonic oscillator, a relaxation oscillator, a ring oscillator, voltage-controlled oscillator, or any electronic circuit that can produce a periodic, oscillating or alternating signal. The system 2000 may include an ADC 210, a first buffer 220, a second buffer 240, a driver (e.g., driver circuit) 250, an oscillator 260, an oscillator calibrator (e.g., oscillator calibrator circuit) 270 and/or an ADC calibrator 290. The ADC calibrator 290 may be any circuit, hardware (e.g., microprocessors), software, firmware, or any combination thereof that can perform calibration of an ADC. Each of the first buffer 220 and the second buffer 240 may be an amplifier with differential inputs (e.g., operational amplifier). The oscillator 260 may be coupled to the driver 250 and the oscillator calibrator 270. The oscillator calibrator 270 may receive a reference clock (Clk_cal) 271 (from an external device or clock source) and a clock signal (Clk_osc) 262 from the oscillator 260. The oscillator calibrator 270 may calibrate a frequency of the oscillator 260. The oscillator calibrator 270 may be any circuit, hardware (e.g., microprocessors), software, firmware, or any combination thereof that implements an oscillator calibration logic that can perform calibration of the frequency of the oscillator 260. Based on a result of the frequency calibration, the oscillator calibrator 270 may send a control signal (Osc_freq_ctrl) 272 to the oscillator 260 to set the frequency of the oscillator to a certain frequency or within a range of frequencies (e.g., target frequency range). After the oscillator frequency is calibrated to be within a target frequency range, the oscillator 260 may send an output signal (e.g., oscillator output signal (Sig_osc) 261) to the driver 250. The output signal 261 may be a single-ended signal or complementary signals (or differential signals). The complementary signals may include a pair of complementary signals (e.g., a positive output signal and a negative output signal, or a pair of signals that are 180 degrees out of phase with each other).

In some embodiments, the oscillator calibrator 270 may adjust or control the frequency of the oscillator 260 to meet a signal frequency requirement of an ADC calibration. In some embodiments, not all 1-tone signals (e.g., a single tone signal which has one frequency) can be used for calibration of a time-interleaved ADC. A system (e.g., oscillator calibrator 270 or ADC calibrator 290) can calculate or choose a target frequency range for a 1-tone calibration signal, experimentally or based on simulation results. In some embodiments, the system may use Equation 1 to calculate a target frequency range for a 1-tone calibration signal. In some embodiments, the system may use Equation 1 to calculate frequencies or a frequency range unsuitable for a 1-tone calibration signal. As long as the signal frequency (e.g., input signal frequency) falls in the target frequency range, the ADC calibrator 290 can achieve good calibration results of interleaving gain. After calculating a target frequency range (e.g., by the oscillator calibrator 270 or the ADC calibrator 290), the oscillator calibrator 270 may send a control signal (e.g., control signal 272) to the oscillator 260 to set the frequency of the oscillator 260 within the calculated target range of frequencies. After the oscillator frequency is calibrated to be within the target frequency range, the oscillator 260 may send an output signal (e.g., oscillator output signal 261) to the driver 250.

Referring to FIG. 2, the driver 250 may receive, as an input signal, the output signal 261 from the oscillator 260 and adjust an amplitude and/or a bandwidth of the input signal according to an amplitude control signal (Atten_ctrl) 252 and/or a bandwidth control signal (BW_ctrl) 253, respectively. The ADC calibrator 290 may generate the amplitude control signal 252 and/or the bandwidth control signal 253. The bandwidth control signal 253 may adjust a rise time and/or a fall time of the input signal 261. Based on a result of the adjustment, the driver 250 may generate an output signal 254 which is to be injected or provided to a main data path toward the ADC 210. The output signal 254 may be a pair of complementary signals (e.g., a pair of signals that are 180 degrees out of phase with each other). The output signal 254 may be provided to an output of the first buffer 220 and an input of the second buffer 240. The first buffer 220 may have impedance higher than impedance of the second buffer 240. In a calibration mode, the driver 250 may be enabled according to an enable control signal (En_drv) 251, the second buffer 240 may be enabled, and the first buffer 220 may be disabled according to an enable control signal (En_buf) 223. For example, the first buffer (e.g., amplifier) 220 may be powered down according to the enable control signal 223 during the calibration to isolate input signals of the ADC (e.g., input voltage signals Vip 221, Vin 222), as well as maximize the swing of the calibration signal (e.g., output signal 254 of the driver 250). In response to the calibration mode, the signal 254 (as a calibration signal) injected from the driver 250 may be sent or provided to the second buffer 240, so that an output signal of the second buffer (e.g., output voltage signals Vop 241, Von 242) can be provided to the ADC 210 for calibration. In a normal mode (e.g., ADC mode), the driver 250 may be disabled according to an enable control signal (e.g., enable control signal 251), the second buffer 240 may be disabled, and the first buffer 220 may be enabled according to an enable control signal (e.g., enable control signal 223). In response to the normal mode, an analog signal (e.g., analog input voltage signals Vip 221, Vin 222) may be sent or provided to the first buffer 220, so that an output signal of the first buffer can be provided to the ADC 210 for analog-digital conversion. The ADC calibrator 290 may determine the calibration mode or the normal mode, and generate, based on a result of the determination, the respective enable control signals 251, 223 of the driver 250, the first buffer 220 and the second buffer 240.

Referring to FIG. 2, the driver 250 may adjust an amplitude and/or a bandwidth of the input signal 261 to meet one or more requirements (e.g., requirement of the amplitude of the calibration signal 254). Besides the frequency, the amplitude of the calibration signal 254 may also affect the calibration of interleaving gain and/or skew. The amplitude of the calibration signal 254 may be set or adjusted to be less than the full scale of the ADC to avoid clipping. The amplitude of the calibration signal 254 may be set or adjusted to be large enough to have a sufficiently short calibration time. The driver 250 may adjust an amplitude of the input signal 261 to be within a target range of the amplitude of a calibration signal to generate the output signal (e.g., calibration signal) 254 which is to be provided to the ADC 210 for calibration.

Figure 3:
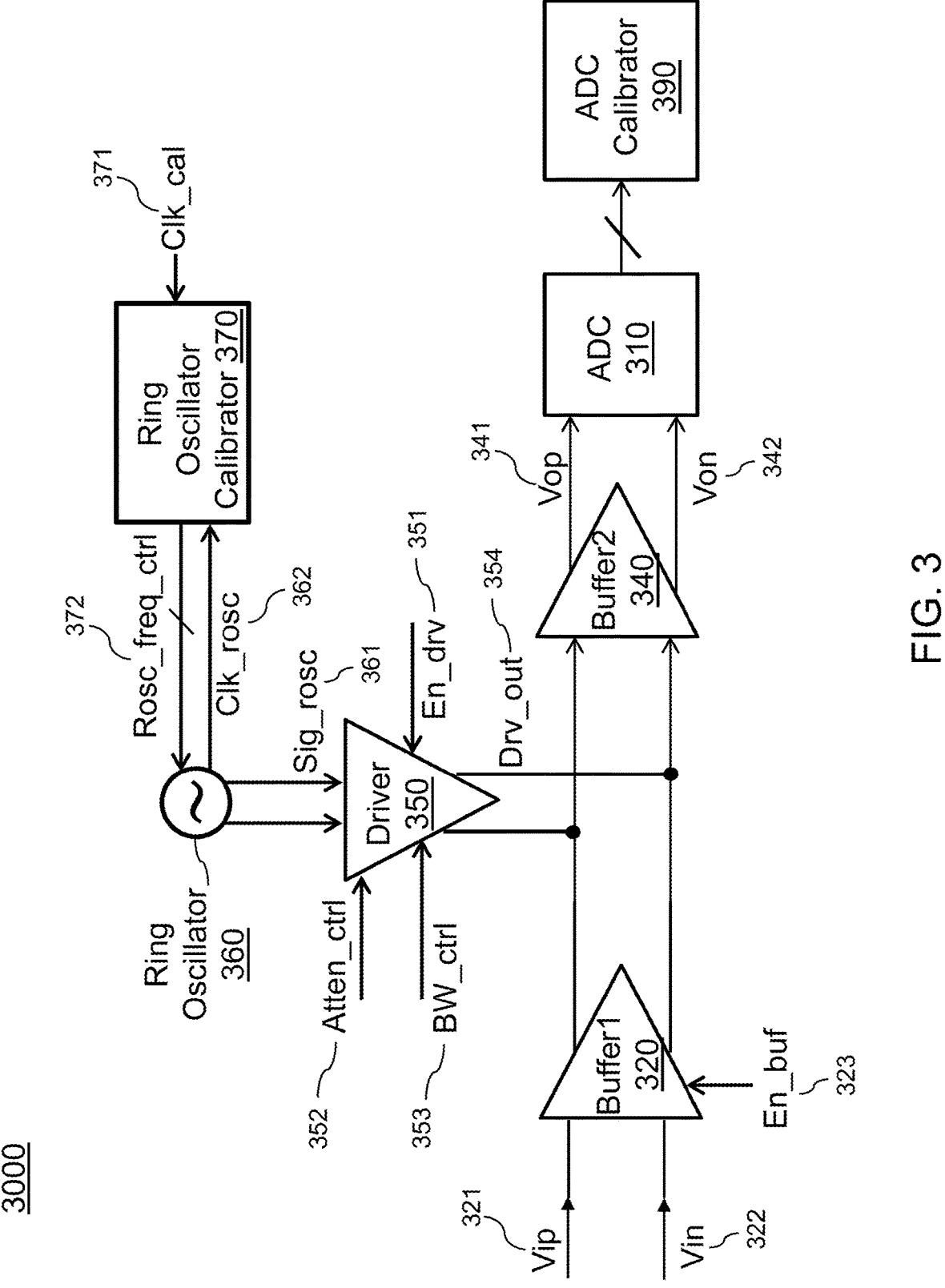
FIG. 3 is a schematic block diagram of an example system of generating signals for ADC calibration using a ring oscillator, according to an embodiment.

FIG. 3 is a schematic block diagram of an example system 3000 of generating signals for ADC calibration using a ring oscillator, according to an embodiment. The system 3000 may include an ADC 310, a first buffer 320, a second buffer 340, a driver (e.g., driver circuit) 350, a ring oscillator 360, a ring oscillator calibrator (e.g., ring oscillator calibrator circuit) 370 and/or an ADC calibrator 390. The ADC calibrator 390 may be any circuit, hardware (e.g., microprocessors), software, firmware, or any combination thereof that can perform calibration of an ADC. Each of the first buffer 320 and the second buffer 340 may be an amplifier with differential inputs (e.g., operational amplifier). The ring oscillator 360 may be coupled to the driver 350 and the ring oscillator calibrator 370. The ring oscillator calibrator 370 may receive a reference clock (Clk_cal) 371 (from an external device or clock source) and a clock signal (Clk_rosc) 362 from the ring oscillator 360. The ring oscillator calibrator 370 may calibrate a frequency of the ring oscillator 360. The ring oscillator calibrator 370 may be any circuit, hardware (e.g., microprocessors), software, firmware, or any combination thereof that implements a ring oscillator calibration logic that can perform calibration of the frequency of the ring oscillator 360. Based on a result of the frequency calibration, the ring oscillator calibrator 370 may send a control signal (Rosc_freq_ctrl) 372 to the ring oscillator 360 to set the frequency of the ring oscillator to a certain frequency or within a range of frequencies (e.g., target frequency range). After the ring oscillator frequency is calibrated to be within a target frequency range, the ring oscillator 360 may send an output signal (e.g., ring oscillator output signal (Sig_rosc) 361) to the driver 350. The output signal 361 may be a single-ended signal or complementary signals (or differential signals). The complementary signals may include a pair of complementary signals (e.g., a positive output signal and a negative output signal, or a pair of signals that are 180 degrees out of phase with each other).

Figure 4:
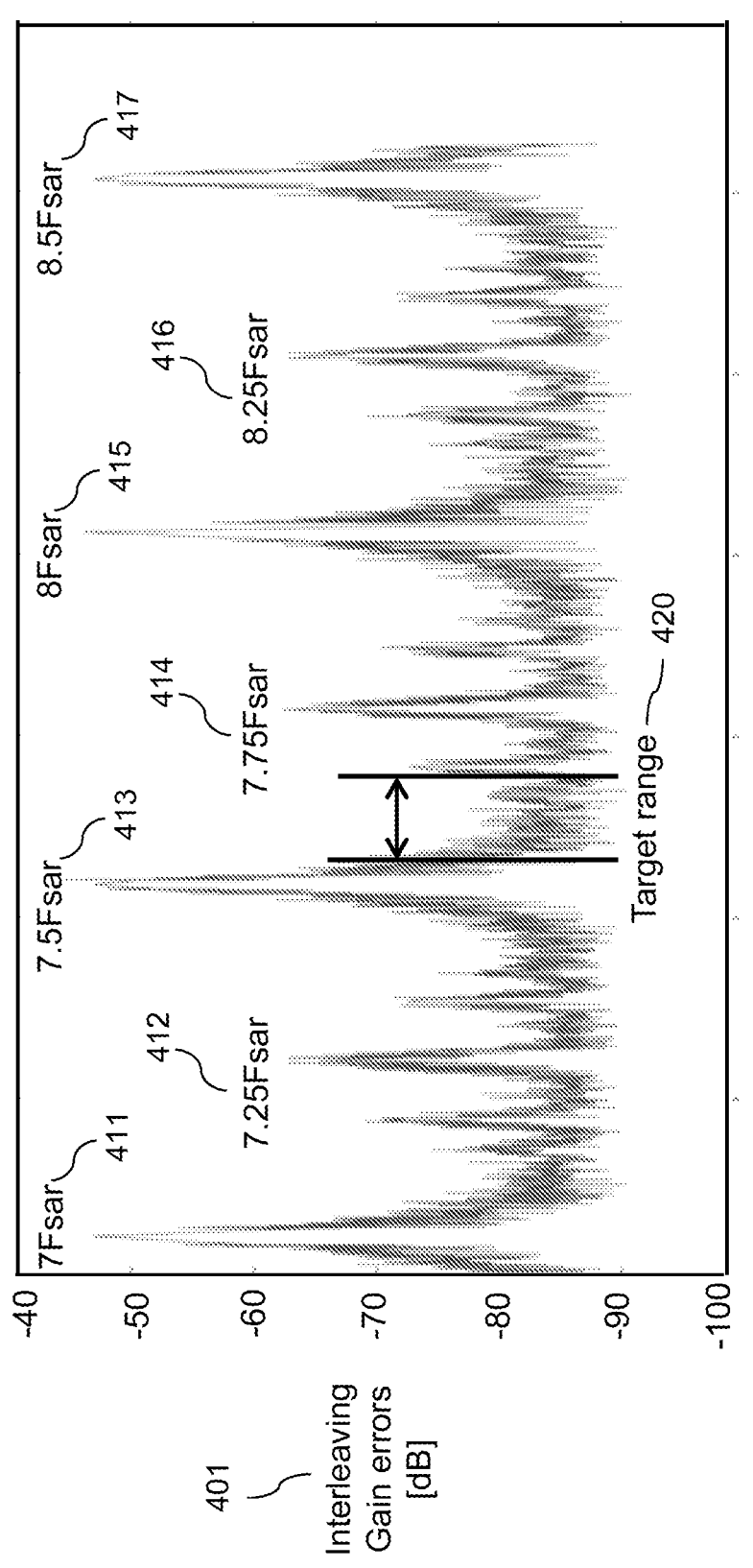
FIG. 4 is a diagram of simulation results showing residual interleaving gain errors with various calibration signal frequencies, in accordance with an embodiment.

In some embodiments, the ring oscillator calibrator 370 may adjust or control the frequency of the ring oscillator 360 to meet a signal frequency requirement of an ADC calibration. In some embodiments, not all 1-tone signals (e.g., a single tone signal which has one frequency) can be used for calibration of a time-interleaved ADC. FIG. 3 is a diagram 3000 of simulation results showing residual interleaving gain errors with various calibration signal frequencies, in accordance with an embodiment. FIG. 4 shows simulated residual interleaving gain errors 402 calibrated with a 1-tone signal at various calibration signal frequencies (e.g., normalized calibration signal frequencies 402). It is shown that there are certain frequencies that are not suitable for ADC calibration because of high interleaving gain errors, e.g., 7 Fsar (411), 7.25 Fsar (412), 7.5 Fsar (413), 7.75 Fsar (414), 8 Fsar (415), 8.25 Fsar (416), 8.5 Fsar (417), etc. It is also shown that there is a frequency range suitable for ADC calibration (e.g., target frequency range 420).

Based on this simulation result (e.g., results shown in FIG. 4), a system (e.g., ring oscillator calibrator 370 or ADC calibrator 390) can calculate or choose a target frequency range (e.g., target frequency range 420) for a 1-tone calibration signal. In some embodiments, the system may use Equation 1 to calculate a target frequency range for a 1-tone calibration signal. In some embodiments, the system may use Equation 1 to calculate frequencies or a frequency range unsuitable for a 1-tone calibration signal. As long as the signal frequency (e.g., input signal frequency) falls in the target frequency range (e.g., range 420), the ADC calibrator 390 can achieve good calibration results of interleaving gain. After calculating a target frequency range (e.g., by the ring oscillator calibrator 370 or the ADC calibrator 390), the ring oscillator calibrator 370 may send a control signal (e.g., control signal 372) to the ring oscillator 360 to set the frequency of the ring oscillator 360 within the calculated target range of frequencies. After the ring oscillator frequency is calibrated to be within the target frequency range, the ring oscillator 360 may send an output signal (e.g., ring oscillator output signal 361) to the driver 350.

Referring to FIG. 3, the driver 350 may receive, as an input signal, the output signal 361 from the ring oscillator 360 and adjust an amplitude and/or a bandwidth of the input signal according to an amplitude control signal (Atten_ctrl) 352 and/or a bandwidth control signal (BW_ctrl) 353, respectively. The ADC calibrator 390 may generate the amplitude control signal 352 and/or the bandwidth control signal 353. The bandwidth control signal 353 may adjust a rise time and/or a fall time of the input signal 361. Based on a result of the adjustment, the driver 350 may generate an output signal 354 which is to be injected or provided to a main data path toward the ADC 310. The output signal 354 may be a pair of complementary signals (e.g., a pair of signals that are 180 degrees out of phase with each other). The output signal 354 may be provided to an output of the first buffer 320 and an input of the second buffer 340. The first buffer 320 may have impedance higher than impedance of the second buffer 340. In a calibration mode, the driver 350 may be enabled according to an enable control signal (En_drv) 351, the second buffer 340 may be enabled, and the first buffer 320 may be disabled according to an enable control signal (En_buf) 323. For example, the first buffer (e.g., amplifier) 320 may be powered down according to the enable control signal 323 during the calibration to isolate input signals of the ADC (e.g., input voltage signals Vip 321, Vin 322), as well as maximize the swing of the calibration signal (e.g., output signal 354 of the driver 350). In response to the calibration mode, the signal 354 (as a calibration signal) injected from the driver 350 may be sent or provided to the second buffer 340, so that an output signal of the second buffer (e.g., output voltage signals Vop 341, Von 342) can be provided to the ADC 310 for calibration. In a normal mode (e.g., ADC mode), the driver 350 may be disabled according to an enable control signal (e.g., enable control signal 351), the second buffer 340 may be disabled, and the first buffer 320 may be enabled according to an enable control signal (e.g., enable control signal 323). In response to the normal mode, an analog signal (e.g., analog input voltage signals Vip 321, Vin 322) may be sent or provided to the first buffer 320, so that an output signal of the first buffer can be provided to the ADC 310 for analog-digital conversion. The ADC calibrator 390 may determine the calibration mode or the normal mode, and generate, based on a result of the determination, the respective enable control signals 351, 323 of the driver 350, the first buffer 320 and the second buffer 340.

Referring to FIG. 3, the driver 350 may adjust an amplitude and/or a bandwidth of the input signal 361 to meet one or more requirements (e.g., requirement of the amplitude of the calibration signal 354). Besides the frequency, the amplitude of the calibration signal 354 may also affect the calibration of interleaving gain and/or skew. The amplitude of the calibration signal 354 may be set or adjusted to be less than the full scale of the ADC to avoid clipping. The amplitude of the calibration signal 354 may be set or adjusted to be large enough to have a sufficiently short calibration time. For example, a target range of the amplitude of a calibration signal may be from −10 dBFS (i.e., decibels relative to full scale) to −2 dBFS. The driver 350 may adjust an amplitude of the input signal 361 to be within a target range of the amplitude of a calibration signal (e.g., −10 dBFS to −2 dBFS) to generate the output signal (e.g., calibration signal) 354 which is to be provided to the ADC 310 for calibration.

Figure 5:
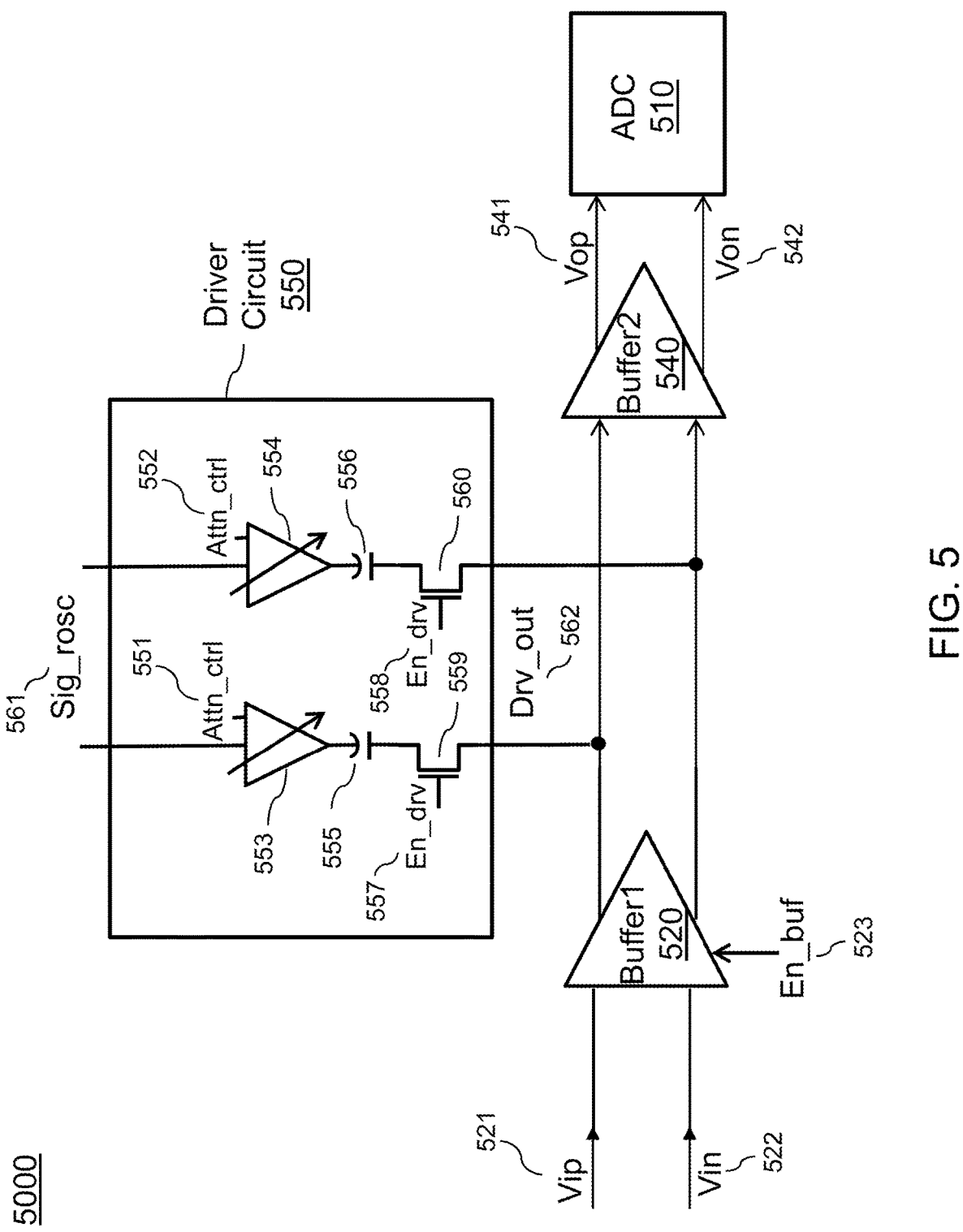
FIG. 5 is a schematic block diagram of an example system of providing signals to an ADC for ADC calibration, according to an embodiment.

FIG. 5 is a schematic block diagram of an example system 5000 of providing signals to an ADC for ADC calibration, according to an embodiment. The system 5000 may include an ADC 510, a first buffer 520, a second buffer 540, and/or a driver (e.g., driver circuit) 550. The ADC 510, the first buffer 520, and the second buffer 540 may have configuration similar to configuration of the ADC 310, the first buffer 320, and the second buffer 340 in FIG. 3, respectively. For example, For example, the first buffer (e.g., amplifier) 520 may be powered down according to an enable control signal 523 during ADC calibration to isolate input signals of the ADC 510 (e.g., input voltage signals Vip 521, Vin 522), as well as maximize the swing of the calibration signal (e.g., output signal 562 of the driver 550). In response to the calibration mode, the signal 562 (as a calibration signal) injected from the driver 550 may be sent or provided to the second buffer 540, so that an output signal of the second buffer (e.g., output voltage signals Vop 541, Von 542) can be provided to the ADC 510 for calibration. In a normal mode (e.g., ADC mode), the driver 550 may be disabled according to an enable control signal (e.g., enable control signals 557, 558), the second buffer 540 may be disabled, and the first buffer 520 may be enabled according to an enable control signal (e.g., enable control signal 523). In response to the normal mode, an analog signal (e.g., analog input voltage signals Vip 521, Vin 522) may be sent or provided to the first buffer 520, so that an output signal of the first buffer can be provided to the ADC 510 for analog-digital conversion.

Referring to FIG. 5, the driver or driver circuit 550 may include a pair of amplifiers (or buffers) 553, 554 with controls, a pair of capacitors 555, 556 respectively coupled to the pair of amplifiers 553, 554, and/or a pair of switches (e.g., a pair of transistors) 559, 560 respectively coupled to the pair of capacitors 555, 556. The capacitors 555, 556 may be AC coupling capacitors that are used to ensure reliability and accommodate different supply domains. The switches 559, 560 may be high speed switching transistors (e.g., bipolar junction transistors (BJT) or metal-oxide-semiconductor field-effect transistor (MOSFET)). The pair of amplifiers 553, 554 may receive, as input signals 561, a pair of complementary clock signals from a ring oscillator (e.g., ring oscillator 360), respectively, adjust an amplitude or signal strength of the respective input signals 561 according to respective attenuation control signals (Attn_ctrl) 551, 552, and generate an output signal (Drv_out) 562 as a calibration signal with the adjusted amplitude or signal strength. The switches 559, 560 may be turned on according to the respective enable control signals 557, 558 (e.g., indicating a value of 1) during calibration of the ADC 510. An ADC calibrator (e.g., ADC calibrator 390) may determine the calibration mode or the normal mode, and generate, based on a result of the determination, the respective enable control signals 557, 558 of the switches 559, 560. In this manner, during the calibration, complementary clock signals 561 from the ring oscillator may be connected, provided, or injected to an output of the first buffer (e.g., amplifier) 520 through the high speed switches 559, 560.

Figure 6:
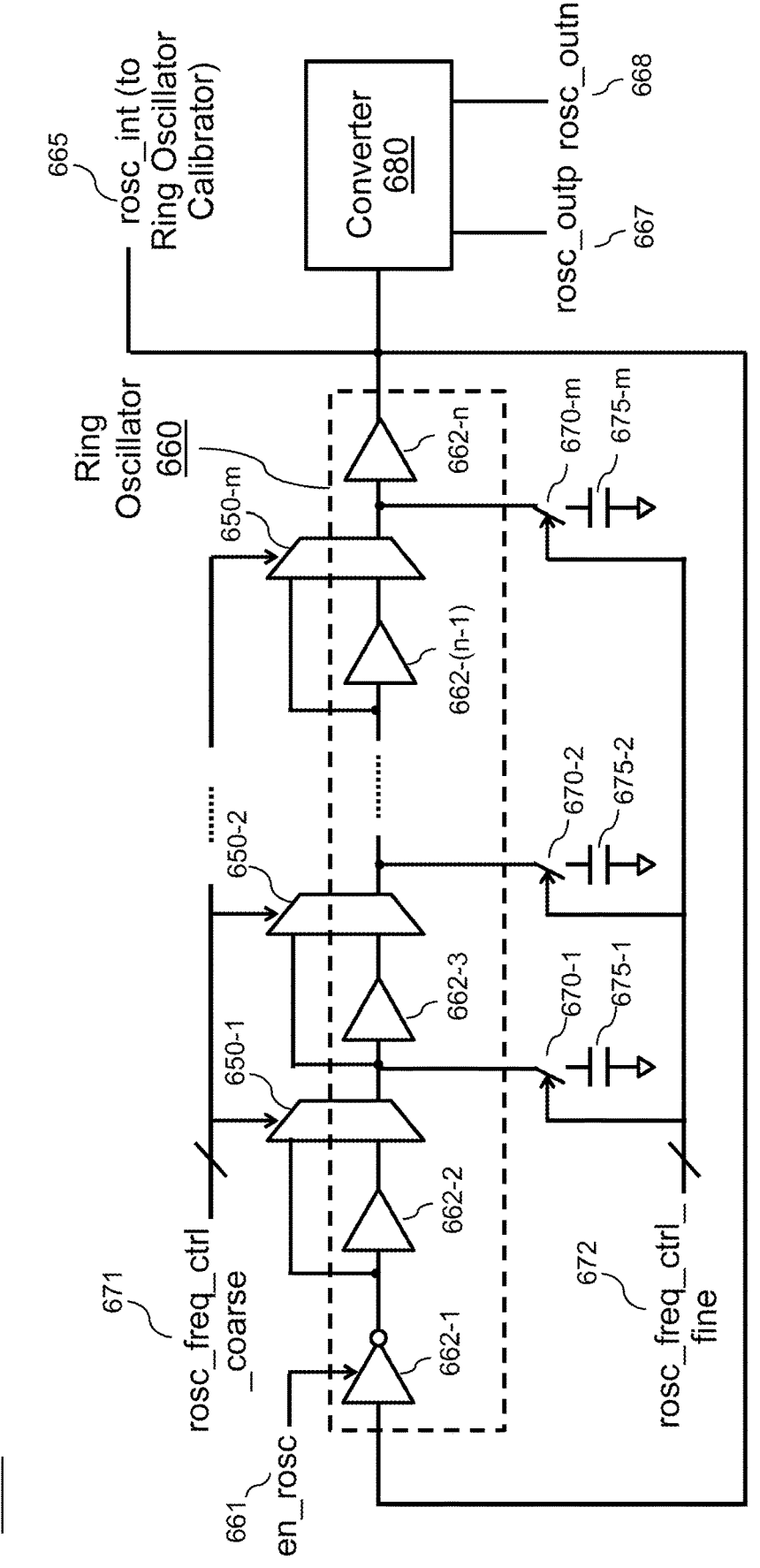
FIG. 6 is a schematic block diagram of an example system of controlling a ring oscillator to adjust frequencies for ADC calibration, according to an embodiment.

FIG. 6 is a schematic block diagram of an example system 6000 of controlling a ring oscillator 660 to adjust frequencies for ADC calibration, according to an embodiment. The system 6000 may be a ring oscillator circuit that controls or adjusts a frequency of the ring oscillator 660 according to one or more control signals 671, 672. The one or more control signals may include a first control signal (rosc_freq_ctrl_coarse) 671 indicating a coarse control (adjustment) of the frequency, and/or a second control signal (rosc_freq_ctrl_fine) 672 indicating a fine control (adjustment) of the frequency. For example, using the first control signal 671 and the second control signal 672, the ring oscillator circuit 6000 may perform both coarse and fine frequency adjustment of the frequency of the ring oscillator 660. The ring oscillator (e.g., ring oscillator loop) 660 may include a plurality of inverters (e.g., an odd number (n) of inverters 662-1, 662-2, 662-3, . . . , 662-*n*). The ring oscillator circuit 6000 may include a plurality of multiplexers (e.g., m number of multiplexers 650-1, 650-2, 650-3, . . . , 650-*m* where m is less than or equal to n), a plurality of switches (e.g., m number of switches 670-1, 670-2, 670-3, . . . , 670-*m*), a plurality of capacitors (e.g., m number of capacitors 675-1, 675-2, 675-3, . . . , 675-*m*), and/or a converter 680.

Referring to FIG. 6, the ring oscillator circuit 6000 may perform a coarse adjustment of the frequency of the ring oscillator 660 through the first control signal 671, which controls the number of inverters in the ring oscillator loop 660. The first control signal 671 may include m number of control signals, each indicating an enable signal or a disable signal. Each of the plurality of multiplexers (e.g., multiplexer 650-1) may select between (1) an input signal of a corresponding inverter (e.g., inverter 662-2) or (2) an output signal of the corresponding inverter (e.g., inverter 662-2), according to a corresponding control signal. For example, the ring oscillator circuit 6000 may provide, to the m number of multiplexers, the first control signal 671 including k enable signals such that the selected k number of inverters are enabled or turned on (k≤m). The ring oscillator circuit 6000 may perform the coarse frequency adjustment to guarantee that the target frequency can be reached under various PVT (process, voltage, temperature) conditions.

Referring to FIG. 6, the ring oscillator circuit 6000 may perform a fine adjustment of the frequency of the ring oscillator 660 through the second control signal 672, which controls the number of capacitors loading the ring oscillator loop 660. The second control signal 672 may include m number of control signals, each indicating a close signal or an open signal. Each of the plurality of switches (e.g., switch 670-1) may selectively connect between (1) an output of a corresponding inverter (e.g., inverter 662-2) or an output of a corresponding multiplexer (e.g., multiplexer 650-1) and (2) a corresponding capacitor (e.g., capacitor 675-1), according to a corresponding control signal. For example, the ring oscillator circuit 6000 may provide, to the m number of switches, the second control signal 672 including k close signals such that k number of capacitors are connected to outputs of the corresponding inverters (or the corresponding multiplexers) through the selected k switches (k≤m). The ring oscillator circuit 6000 may perform the fine frequency adjustment to perform a small frequency calibration of the ring oscillator 660 and ensure that the frequency of the ring oscillator 660 is accurate enough to avoid unsuitable frequencies as shown in the simulation result (see FIG. 4) or as calculated using Equation 1.

Referring to FIG. 6, to change the frequency of the ring oscillator 660, a system or a circuit (e.g., ring oscillator calibrator 370 or ADC calibrator 390 in FIG. 3) may use three methods (there are also other methods). First, the system or the circuit can change the number of inverters (e.g., inverters 662) and/or buffers in the ring oscillator chain, resulting in a higher or lower frequency of the ring oscillator 660. Second, the system or the circuit can change the supply voltage to the ring oscillator 660, thereby increasing or reducing the propagation delay through the chain of stages, and changing the frequency of the ring oscillator 660. Third, the system or the circuit can change the number of capacitors (e.g., capacitors 675) loading the ring oscillator loop, thereby changing the propagation delay through the chain of stages, and changing the frequency of the ring oscillator 660.

Referring to FIG. 6, the converter 680 may be configured to convert a single-ended output signal of the ring oscillator (e.g., output signal (rosc_int) 665) to a pair of complementary output signals (e.g., output signals (rosc_outp, rosc_outn) 667, 668). The single-ended output signal may be a signal that is referenced to a shield (for example, earth ground on an output connector). The pair of complementary output signals may have both (1) a first signal on a channel and (2) an inverted version of the first signal (e.g., 180 degrees out of phase with the first signal). The ring oscillator 660 may be only enabled during the ADC calibration according to an enable control signal (en_rosc) 661. During the ADC calibration, the ring oscillator 660 may provide the output signal (e.g., single-ended output signal) 665 to a ring oscillator calibrator circuit (e.g., ring oscillator calibrator 370). After the calibration is done, the ring oscillator 660 may be disabled according to the enable control signal 661 which indicates 0, for example.

Figure 7:
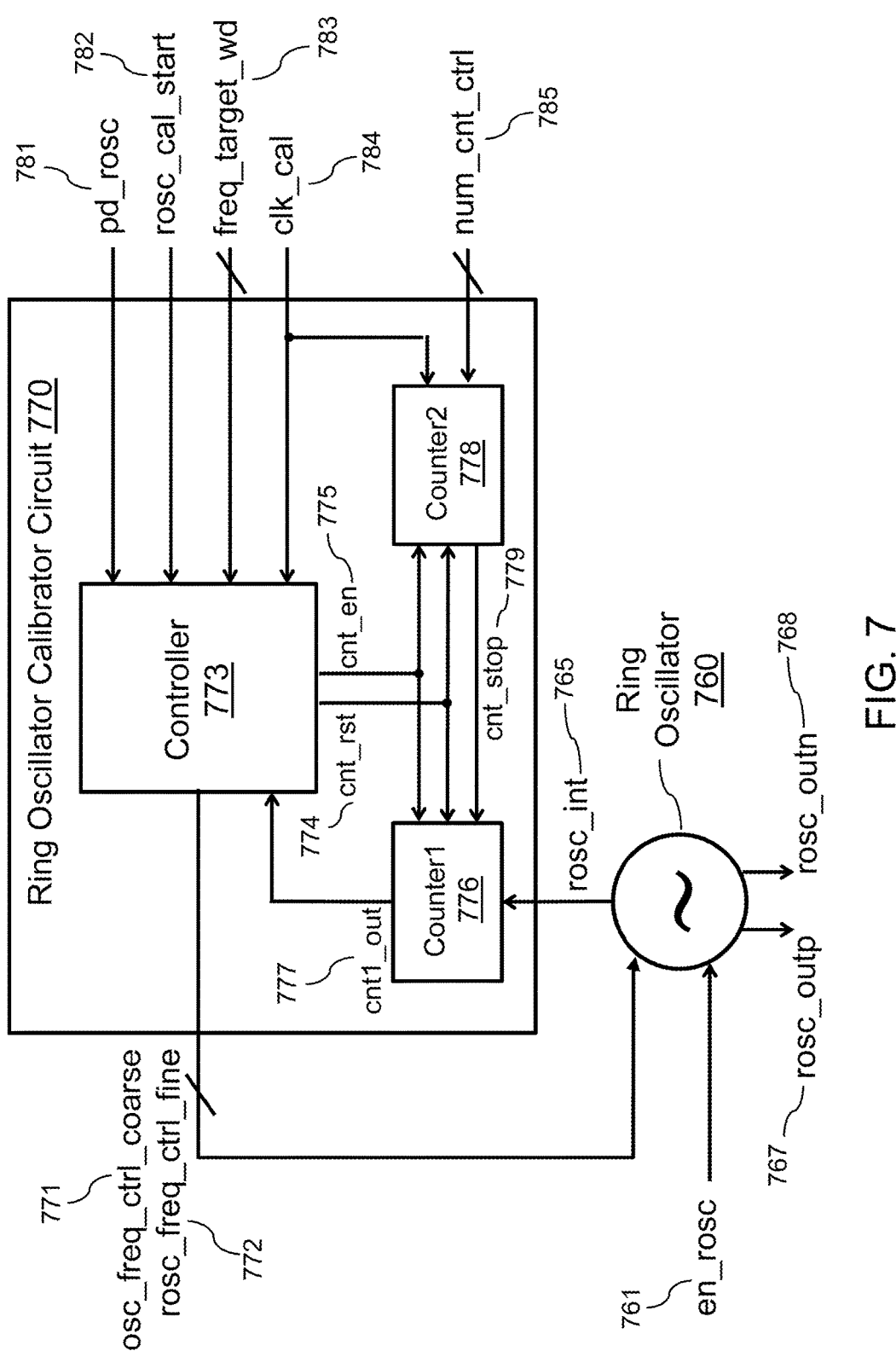
FIG. 7 is a schematic block diagram of an example system of calibrating a frequency of a ring oscillator for ADC calibration, according to an embodiment.

FIG. 7 is a schematic block diagram of an example system 7000 of calibrating a frequency of a ring oscillator for ADC calibration, according to an embodiment. The system 7000 may include a ring oscillator 760 and a circuit (e.g., ring oscillator calibrator circuit 770) which is configured to perform a frequency calibration of the ring oscillator 760. The ring oscillator 760 may be enabled or disabled according to a enable control signal (en_rosc) 761. The ring oscillator 760 may be enabled during ADC calibration to provide an output signal (e.g., single-ended output signal (rosc_int) 765) to the ring oscillator calibrator circuit 770, and perform adjustment or calibration of the frequency of the ring oscillator (e.g., by ring oscillator circuit 6000) according one or more control signals (rosc_freq_ctrl_coarse, rosc_freq_ctrl_fine) 771, 772 that are received from the ring oscillator calibrator circuit 770. After completion of the frequency adjustment or calibration, the ring oscillator 760 may generate an output signal (e.g., a pair of complementary output signals (rosc_outp, rosc_outn) 767, 768) for the ADC calibration. An ADC calibrator (e.g., ADC calibrator 390 in FIG. 3) may determine the calibration mode or the normal mode, and generate, based on a result of the determination, the enable control signal 761 of the ring oscillator 760.

Referring to FIG. 7, the ring oscillator calibration circuit 770 may include a first counter 776, a second counter 778, and a controller 773. The controller 773 may be any circuit, hardware (e.g., microprocessors), software, firmware, or any combination thereof that can control the first counter 776, the second counter 778, and the ring oscillator 760 using one or more control signals (e.g., signals 771, 772, 774, 775). The controller 773 may implement a finite-state machine (FSM). The controller 773 may receive a calibration start signal (rosc_cal_start) 782, a signal 783 indicating a target frequency word (freq_target_wd), a power down signal (pd_rosc) 781, and/or a reference clock signal (clk_cal) 784. In some embodiments, an ADC calibrator (e.g., ADC calibrator 390) may generate the calibration start signal 782, the signal 783 indicating the target frequency word, and/or the power down signal 781. The reference clock signal 784 may be a system clock signal. The controller 773 may receive a counter output signal (cntl_out) 777 from the first counter 776. The controller 773 may output (1) a counter reset signal (cnt_rst) 774 to the first counter 776 and the second counter 778, (2) a counter enable signal (cnt_en) 775 to the first counter 776 and the second counter 778, and/or (3) one or more control signals including a first control signal 771 for coarse frequency adjustment and a second control signal 772 for fine frequency adjustment, to the ring oscillator 760. The counter reset signal 774 may be a pulse signal. The first counter 776 may perform counting while being clocked by a clock signal (rosc_int) 765 from the ring oscillator 760, and output the counter output signal 777 indicating a counter value of the first counter 776. The second counter 778 may receive a number control signal (num_cnt_ctrl) 785 indicating a target counter value, perform counting while being clocked by the reference clock signal 784, determine whether a counter value of the second counter reaches the target counter value. In response to determining that the counter value of the second counter reaches the target counter value, the second counter 778 may output a counter stop signal (cnt_stop) 779 to the first counter 776, thereby controlling the first counter 676 to stop counting.

Referring to FIG. 7, in response to receiving the calibration start signal 782, the controller 773 may generate the counter reset signal 774 to reset the first counter 776 and the second counter 778. In response to receiving the counter reset signal 774, the controller may reset the first counter 776 (e.g., set the first counter to zero) and control the first counter 776 to start counting while being clocked by the clock signal 765 from the ring oscillator 760. In response to receiving the counter reset signal 774, the controller may reset the second counter 778 (e.g., set the second counter to zero) and control the second counter 778 to start counting while being clocked by the reference clock signal 784. In response to determining that the counter value of the second counter 778 reaches the target counter value, as specified by number control signal 785, the second counter 778 may send out the counter stop signal 779 to stop the first counter 776 from counting. In response to the first counter 776 being stopped, the controller 773 may read the counter output signal 777 indicating the current counter value of the first counter 776, and compare the current counter value with the target frequency word indicated by the signal 783. In response to determining that the current counter value (of the first counter 776) is greater than the target frequency word, the controller 773 may generate, based on a difference between the current counter value and the target frequency word, the first control signal 771 and/or the second control signal 772 to adjust (e.g., reduce or decrease) the frequency of the ring oscillator 760. Similarly, in response to determining that the current counter value (of the first counter 776) is smaller than the target frequency word, the controller 773 may generate, based on a difference between the current counter value and the target frequency word, the first control signal 771 and/or the second control signal 772 to adjust (e.g., increase) the frequency of the ring oscillator 760. In some embodiments, the coarse frequency adjustment may be performed first (by the ring oscillator circuit 6000), followed by performing the fine frequency adjustment (by the ring oscillator circuit 6000). In response to determining that the current counter value (of the first counter 776) is equal to, or sufficiently close (e.g., within a predetermined range) to, the target frequency word (indicated by the signal 783), the controller 773 may determine that the frequency calibration is completed, and disable both the first counter 776 and the second counter 778 by setting the counter enable signal 775 to 0, for example. In response to determining that the frequency calibration is completed, the ring oscillator 760 may be used for ADC calibration. In response to determining that the ADC calibration is completed, the ring oscillator calibration circuit 770 may be power down according to the power down signal 781 which is set to 1. In some embodiments, in response to determining that the ADC calibration is completed, a ADC calibrator (e.g., ADC calibrator 390) may set the power down signal 781 to 1.

Figure 8:
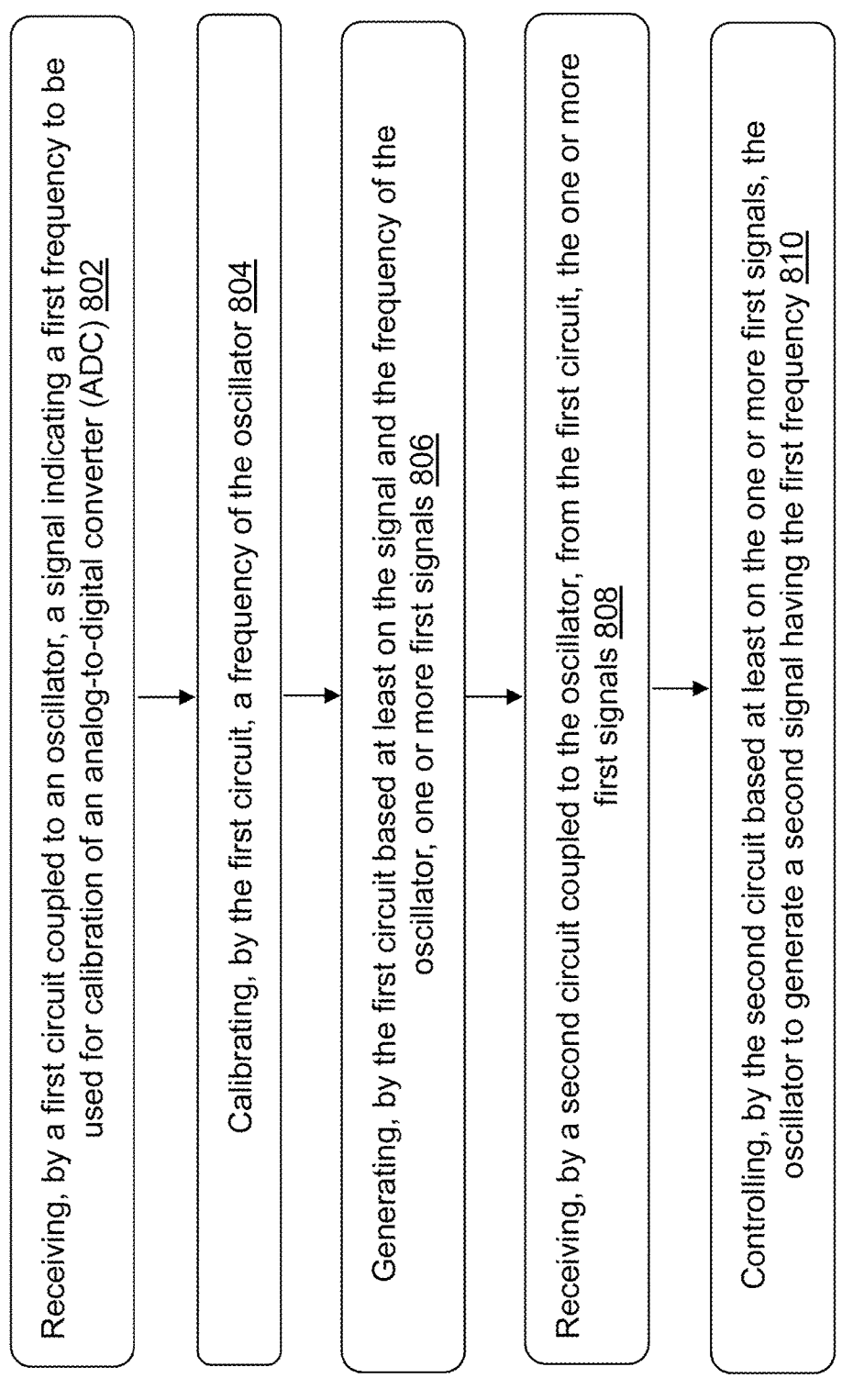
FIG. 8 is a flow diagram showing a process of generating signals for ADC calibration using an oscillator, in accordance with an embodiment.

FIG. 8 is a flow diagram showing a process 8000 of generating signals for ADC calibration using a ring oscillator (e.g., ring oscillator 360, 660, 760), in accordance with an embodiment. In some embodiments, the process 8000 is performed by a first circuit (e.g., oscillator calibrator circuit 270, ring oscillator calibrator circuit 370, 770) and/or a second circuit (e.g., oscillator 260, ring oscillator 360, ring oscillator circuit 6000). The first circuit may be coupled to an oscillator (e.g., oscillator 260, ring oscillator 360, 660, 760). The second circuit may be coupled to the oscillator. In some embodiments, the first circuit and the second circuit may be implemented in the same circuit or the same integrated circuit or chip. In other embodiments, the process 8000 is performed by other entities. In some embodiments, the process 8000 includes more, fewer, or different steps than shown in FIG. 8.

At step 802, the first circuit may receive a signal (e.g., signal 783) indicating a first frequency (e.g., target frequency word) to be used for calibration of an ADC (e.g., ADC 210, 310, 510). In some embodiments, the first circuit may include a controller (e.g., controller 773), a first counter (e.g., first counter 776), and a second counter (e.g., second counter 778). The first counter may be configured to receive a first clock signal (e.g., first clock signal 765) outputted from the oscillator (e.g., ring oscillator 760). The second counter may be configured to receive a second clock signal (e.g., second clock signal 784). The controller may be a circuit implementing a finite-state machine (FSM).

At step 804, the first circuit may calibrate a frequency of the oscillator. The controller may be configured to receive the signal (e.g., signal 783) indicating a first quantity (e.g., target frequency word) corresponding to the first frequency. The controller may be configured to receive a third signal (e.g., signal 782) indicating to start calibrating the oscillator.

At step 806, the first circuit may generate, based at least on the signal (e.g., signal 783 indicating the target frequency word) and the frequency of the oscillator (e.g., current frequency of the oscillator), one or more first signals (e.g., signals 771, 772). In response to the third signal (e.g., third signal 782), the controller may be configured to reset the first counter and the second counter, control each of the first counter and the second counter to start counting, and determine whether a counter number indicated by an output of the second counter (e.g., output signal 777) is equal to a second quantity (e.g., target counter value indicated by the signal 785). In response to determining that the counter number of the second counter is equal to the second quantity, the controller may be configured to control the first counter to stop counting and determine whether a counter number indicated by an output of the first counter is equal to the first quantity (e.g., target frequency word). In response to determining that the counter number of the first counter (e.g., counter number indicated by the signal 777) is not equal to the first quantity (e.g., target frequency word), the controller may be configured to generate the one or more first signals (e.g., signals 771, 772). In response to determining that the counter number of the first counter is equal to the first quantity, the controller 773 may be configured to disable the first counter 776 and the second counter 778 (e.g., by setting the signal 775 to 0). In some embodiments, the controller may be configured to receive a fifth signal (e.g., signal 781) indicating to enable (e.g., when the signal 781 indicates 0) or disable (e.g., when the signal 781 indicates 1) the first circuit 770 such that the first circuit 770 is enabled during the calibration of the ADC and is disabled responsive to the ADC being calibrated.

At step 808, the second circuit (e.g., oscillator 260, ring oscillator 360, ring oscillator circuit 6000) may receive, from the first circuit, the one or more first signals (e.g., control signals 771, 772 or control signals 671, 672). The oscillator may be a ring oscillator (e.g., ring oscillator 660) including a plurality of amplifiers (e.g., inverters 662-1, . . ., 662-n). The one or more first signals may include a first control signal (e.g., first control signal 671) and a second control signal (e.g., second control signal 672). The second circuit may be configured to determine a first number of amplifiers (e.g., k number of inverters), among the plurality of amplifiers (e.g., among n number of inverters), according to the first control signal. The second circuit may be configured to enable the first number of amplifiers (e.g., k number of inverters), among the plurality of amplifiers (e.g., among n number of inverters). The second circuit may be configured to determine a second number of capacitors (e.g., k number of capacitors among capacitors 675-1, . . ., 675-m) according to the second control signal. The second circuit may be configured to connect the second number of capacitors (e.g., k number of capacitors) to respective amplifiers (e.g., k number of inverters), among the plurality of amplifies (e.g., among n number of inverters).

At step 810, the second circuit may control, based at least on the one or more first signals (e.g., signals 671, 672), the oscillator to generate a second signal having the first frequency (e.g., output signal 665 of the ring oscillator 660 when the frequency calibration is completed). In some embodiments, the second circuit may be configured to receive a sixth signal (e.g., signal 661) indicating to enable or disable the oscillator such that the oscillator is enabled during the calibration of the ADC and is disabled responsive to the ADC being calibrated (e.g., the ADC calibration is completed). The second circuit may be configured to enable or disable the oscillator according to the sixth signal.

The term "circuitry" and variations thereof include (1) hardware, one or more processors (e.g., microprocessor) or a combination of hardware and/or one or more processors with software and/or firmware; or (2) a single component or a combination of multiple components. The term "controller" and variations thereof include any circuit, hardware, processor (e.g., microprocessor), or a combination of a combination of hardware and/or one or more processors with software and/or firmware.

Systems and methods described herein may be embodied in other specific forms without departing from the characteristics thereof. References to "approximately," "about" "substantially" or other terms of degree include variations of +/−10% from the given measurement, unit, or range unless explicitly indicated otherwise. References to a certain amount or value also include variations of +/−10% from the given measurement, unit, or range unless explicitly indicated otherwise, such that allowances are made for engineering tolerances, deviations, noise, settling time, etc. For example, "an output signal having a first frequency and/or a first amplitude" does not need to match the first frequency and/or the first amplitude exactly and just has to be close enough from an engineering perspective.

The term "coupled" and variations thereof include the joining of two members directly or indirectly to one another. The term "electrically coupled" and variations thereof includes the joining of two members directly or indirectly to one another through conductive materials (e.g., metal or copper traces). Such joining (for both terms "coupled" and "electrically coupled") may be stationary (e.g., permanent or fixed) or moveable (e.g., removable or releasable). Such joining (for both terms "coupled" and "electrically coupled") may be achieved with the two members coupled directly with or to each other, with the two members coupled with each other using a separate intervening member and any additional intermediate members coupled with one another, or with the two members coupled with each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

It should be noted that certain passages of this disclosure can reference terms such as "first" and "second" in connection with subsets of transmit spatial streams, sounding frames, response, and devices, for purposes of identifying or differentiating one from another or from others. These terms are not intended to merely relate entities (e.g., a first device and a second device) temporally or according to a sequence, although in some cases, these entities can include such a relationship. Nor do these terms limit the number of possible entities that can operate within a system or environment. It should be understood that the systems described above can provide multiple ones of any or each of those components and these components can be provided on either a stand-alone machine or, in some embodiments, on multiple machines in a distributed system. In addition, the systems and methods described above can be provided as one or more computer-readable programs or executable instructions embodied on or in one or more articles of manufacture, e.g., a floppy disk, a hard disk, a CD-ROM, a flash memory card, a PROM, a RAM, a ROM, or a magnetic tape. The programs can be implemented in any programming language, such as LISP, PERL, C, C++, C#, or in any byte code language such as JAVA. The software programs or executable instructions can be stored on or in one or more articles of manufacture as object code. In some embodiments, the ADC is employed as an integrated circuit in a transmitter for wireless communication. The ADC is provided on an integrated circuit that includes the calibration engine. The ADC and calibration engine are provided in a single chip or multichip integrated package in some embodiments.

While the foregoing written description of the methods and systems enables one of ordinary skill to make and use embodiments thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

What is claimed is:

1. A device comprising:
an oscillator coupled to circuitry providing calibration of the oscillator, the oscillator configured to receive from the circuitry a first signal that causes the oscillator to generate a second signal having a first frequency to be used for calibration of an analog-to-digital converter (ADC); and
a driver coupled to the oscillator and the ADC, the driver configured to:
receive the second signal from the oscillator;
receive a third signal indicating an amplitude to apply to the second signal;
provide, to the ADC based at least on the second signal and the third signal, an output signal having the first frequency and the amplitude; and
disable a first amplifier during the calibration of the ADC and enable the first amplifier responsive to the ADC being calibrated.

2. The device of claim 1, wherein the second signal is a pair of signals that are 180 degrees out of phase with each other.

3. The device of claim 1, wherein the driver is configured to:
receive a fourth signal indicating a rise time and a fall time to apply to the second signal; and
provide, to the ADC based at least on the second signal, the third signal and the fourth signal, an output signal having the first frequency, the amplitude, the rise time, and the fall time.

4. The device of claim 1, wherein the driver comprises:
one or more amplifiers coupled to the oscillator and configured to amplify the second signal based at least on the third signal to generate the output signal.

5. The device of claim 4, wherein the driver comprises:
one or more capacitors coupled to an output of the one or more amplifier, wherein the driver is configured to provide, to the ADC, the output signal through the one or more capacitors.

6. The device of claim 4, wherein the driver comprises:
one or more switches coupled to an output of the one or more amplifiers,
wherein the driver is further configured to
receive a fifth signal indicating to enable or disable the driver such that the driver is enabled during the calibration of the ADC and is disabled responsive to the ADC being calibrated, and
turn on or turn off the one or more switches according to the fifth signal.

7. The device of claim 1, wherein
the ADC receives one or more input signals through the first amplifier.

8. The device of claim 7, wherein the driver is configured to:
provide, to the first amplifier, a sixth signal indicating to enable or disable the first amplifier such that the first amplifier is disabled during the calibration of the ADC and is enabled responsive to the ADC being calibrated, and
turn on or turn off the first amplifier according to the sixth signal.

9. The device of claim 7, wherein during the calibration of the ADC,
the driver is configured to provide the output signal to a second amplifier that has impedance smaller than the impedance of the first amplifier, and
the ADC receives the one or more input signals from the second amplifier.

10. Circuitry comprising:
a first circuit coupled to an oscillator and configured to:
receive a signal indicating a first frequency to be used for calibration of an analog-to-digital converter (ADC),
calibrate a frequency of the oscillator, and
generate, based at least on the signal and the frequency of the oscillator, one or more first signals; and
a second circuit coupled to the oscillator and configured to:
receive, from the first circuit, the one or more first signals, and
control, based at least on the one or more first signals, the oscillator to generate a second signal having the first frequency,
wherein the first circuit comprises:
a first counter configured to receive a first clock signal outputted from the oscillator, and
the frequency of the oscillator is calibrated using the first counter.

11. The circuitry of claim 10, wherein the first circuit comprises:
a controller;
and
a second counter configured to receive a second clock signal.

12. The circuitry of claim 11, wherein the controller is a circuit implementing a finite-state machine (FSM).

13. The circuitry of claim 11, wherein the controller is configured to:
receive the signal indicating a first quantity corresponding to the first frequency;
receive a third signal indicating to start calibrating the oscillator;
in response to the third signal, reset the first counter and the second counter, control each of the first counter and the second counter to start counting, and determine whether a counter number indicated by an output of the second counter is equal to a second quantity;

in response to determining that the counter number of the second counter is equal to the second quantity, control the first counter to stop counting and determine whether a counter number indicated by an output of the first counter is equal to the first quantity; and in response to determining that the counter number of the first counter is not equal to the first quantity, generate the one or more first signals.

14. The circuitry of claim 13, wherein the controller is configured to:

in response to determining that the counter number of the first counter is equal to the first quantity, disable the first counter and the second counter.

15. The circuitry of claim 11, wherein the controller is configured to:

receive a fifth signal indicating to enable or disable the first circuit such that the first circuit is enabled during the calibration of the ADC and is disabled responsive to the ADC being calibrated.

16. The circuitry of claim 10, wherein the oscillator is a ring oscillator, the ring oscillator comprises a plurality of amplifiers, the one or more first signals comprises a first control signal and a second control signal, and the second circuit is configured to:

determine a first number of amplifiers, among the plurality of amplifiers, according to the first control signal; and enable the first number of amplifiers, among the plurality of amplifiers.

17. The circuitry of claim 16, wherein the second circuit is configured to:

determine a second number of capacitors according to the second control signal, and connect the second number of capacitors to respective amplifiers, among the plurality of amplifies.

18. The circuitry of claim 10, wherein the second circuit is configured to:

receive a sixth signal indicating to enable or disable the oscillator such that the oscillator is enabled during the calibration of the ADC and is disabled responsive to the ADC being calibrated; and enable or disable the oscillator according to the sixth signal.

19. A method comprising:

receiving, by a first circuit coupled to an oscillator, a signal indicating a first frequency to be used for calibration of an analog-to-digital converter (ADC);

calibrating, by the first circuit, a frequency of the oscillator;

generating, by the first circuit based at least on the signal and the frequency of the oscillator, one or more first signals;

receiving, by a second circuit coupled to the oscillator, from the first circuit, the one or more first signals; and controlling, by the second circuit based at least on the one or more first signals, the oscillator to generate a second signal having the first frequency, wherein the oscillator is enabled during the calibration of the ADC and is disabled responsive to the ADC being calibrated.

20. The method of claim 19, further comprising:

receiving, by the second circuit, a further signal indicating to enable or disable the oscillator such that the oscillator is enabled during the calibration of the ADC and is disabled responsive to the ADC being calibrated; and enabling or disabling, by the second circuit, the oscillator according to the further signal.

* * * * *